US012641761B2

(12) United States Patent
Hwang et al.

(10) Patent No.: US 12,641,761 B2
(45) Date of Patent: May 26, 2026

(54) DISPLAY DEVICE WITH AN INNER PLATE OF A CORRESPONDING SIZE TO A MOUNTING PORTION

(71) Applicant: LG ELECTRONICS INC., Seoul (KR)

(72) Inventors: Jihwan Hwang, Seoul (KR); Seokbong Han, Seoul (KR); Kwangho Shin, Seoul (KR); Soohong An, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 282 days.

(21) Appl. No.: 18/686,138

(22) PCT Filed: Sep. 27, 2021

(86) PCT No.: PCT/KR2021/013087

§ 371 (c)(1),
(2) Date: Feb. 23, 2024

(87) PCT Pub. No.: WO2023/048307

PCT Pub. Date: Mar. 30, 2023

(65) Prior Publication Data

US 2024/0381596 A1      Nov. 14, 2024

(51) Int. Cl.
*H05K 7/20* (2006.01)
*G02F 1/1333* (2006.01)
*H05K 5/03* (2006.01)

(52) U.S. Cl.
CPC ... *H05K 7/20963* (2013.01); *G02F 1/133314* (2021.01); *H05K 5/03* (2013.01); *H05K 7/20454* (2013.01)

(58) Field of Classification Search
CPC ............. H05K 7/2039; H05K 7/20454; H05K 7/20509; H05K 7/20963; H05K 5/03; H05K 5/10; G02F 1/133314
See application file for complete search history.

(56) References Cited

U.S. PATENT DOCUMENTS

2013/0100356 A1*   4/2013   Suzuki ............... H05K 7/20963
                                                    362/97.1
2014/0313424 A1*   10/2014   Imajo ................ G02F 1/133603
                                                    349/67
(Continued)

FOREIGN PATENT DOCUMENTS

KR      10-2003-0094702      12/2003
KR      10-2007-0120748      12/2007
(Continued)

OTHER PUBLICATIONS

PCT International Application No. PCT/KR2021/013087, International Search Report dated Jun. 17, 2022, 11 pages.
(Continued)

*Primary Examiner* — Jayprakash N Gandhi
*Assistant Examiner* — Steven Ngo
(74) *Attorney, Agent, or Firm* — LEE, HONG, DEGERMAN, KANG & WAIMEY

(57) ABSTRACT

A display device comprises: a display module; a module cover disposed at the rear surface of the display module and including a mounting part to which a circuit board is fastened; a printed circuit board fastened to the mounting part; and an inner plate disposed between the display module and the module cover, wherein the inner plate has a size corresponding to the size of the mounting part and is disposed at the front surface of the mounting part. The display device can reduce the scale of the inner plate, and thus the manufacturing cost and weight thereof can be reduced.

5 Claims, 9 Drawing Sheets

(56) References Cited

U.S. PATENT DOCUMENTS

| | | | |
|---|---|---|---|
| 2017/0064851 A1* | 3/2017 | Shin | F16M 11/22 |
| 2017/0315400 A1* | 11/2017 | Ahn | G02F 1/133308 |
| 2017/0318694 A1* | 11/2017 | Yun | H05K 5/0217 |
| 2019/0069425 A1* | 2/2019 | Ryu | G02F 1/133308 |
| 2020/0027391 A1* | 1/2020 | Cho | H05K 7/20963 |
| 2020/0326582 A1* | 10/2020 | Azuma | G06F 1/1626 |

FOREIGN PATENT DOCUMENTS

| | | |
|---|---|---|
| KR | 10-2011-0035649 | 4/2011 |
| KR | 10-2020-0122852 | 10/2020 |
| WO | 2021-187711 | 9/2021 |

OTHER PUBLICATIONS

European Patent Office Application Serial No. 21958484.4-1001, Search Report dated Jun. 16, 2025, 6 pages.

* cited by examiner (a)

(b)

(a)                    (b)                    (c)

(a)

(b)

| Thermal cushion | X | O |
|---|---|---|
| Temperature (℃) | 57.7 | 49.4 |

DISPLAY DEVICE WITH AN INNER PLATE OF A CORRESPONDING SIZE TO A MOUNTING PORTION

CROSS-REFERENCE TO RELATED APPLICATION(S)

This application is the National Stage filing under 35 U.S.C. 371 of International Application No. PCT/KR2021/013087, filed on Sep. 27, 2021, the contents of which is hereby incorporated by reference herein in its entirety.

TECHNICAL FIELD

The present disclosure relates to a display device that includes a module cover whose weight may be reduced.

BACKGROUND

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

In particular, in case of the organic light-emitting display device, the backlight is omitted, a layered structure is simple and light, and a housing structure is also able to be constructed more simply than that in the liquid crystal display device, so that research on reducing a weight of the display device is active.

SUMMARY

Technical Problem

The present disclosure is to provide a display device that includes a module cover whose weight may be reduced.

Technical Solutions

Provided is a display device including a display module, a module cover located on a rear surface of the display module and including a mounting portion coupled with a circuit board, a printed circuit board coupled to the mounting portion, and an inner plate located between the display module and the module cover, wherein the inner plate has a size corresponding to a size of the mounting portion and is disposed on a front surface of the mounting portion.

The display device may further include a first bead press-molded at a perimeter of the module cover, an adhesive tape located on the first bead, and a heat dissipating cushion located on the first bead.

The first bead may include a protruding portion rearwardly protruding the most, and an inclined portion extending inwardly of the module cover from the protruding portion, the adhesive tape may be located on the protruding portion, and the heat dissipating cushion may be located on the inclined portion.

The heat dissipating cushion may include an aluminum mesh.

The inner plate and the module cover may be fastened to each other via a clinching scheme.

The display device may further include a second bead press-molded on the mounting portion, and a press boss press-molded on the mounting portion.

The inner plate may include a galvanized iron steel plate.

Advantageous Effects

The display device of the present disclosure may reduce the manufacturing cost and reduce the weight by reducing the inner plate in size.

In addition, the decrease in the rigidity and the heat dissipation performance caused by reducing the inner plate in size may be solved via the module cover.

Effects obtainable from the present disclosure are not limited by the above mentioned effects, and other unmentioned effects can be clearly understood from the above description by those having ordinary skill in the technical field to which the present disclosure pertains.

DETAILED DESCRIPTION

Figure 1:
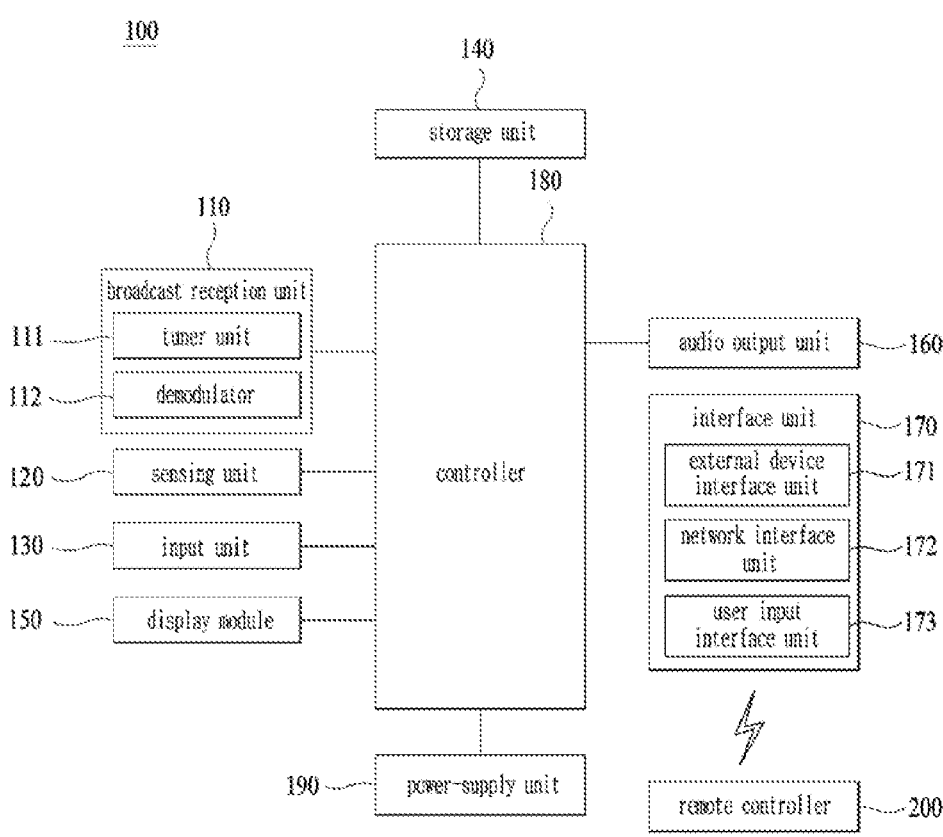
FIG. 1 is a block diagram illustrating components of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device described in this specification is, for example, an intelligent image display device having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100. The display device 100 may include a broadcast reception unit 110, an external device interface unit 171, a network interface unit 172, a storage unit 140, a user input interface unit 173, an input unit 130, a controller 180, a display module 150, an audio output unit 160, and/or a power supply unit 190.

The broadcast reception unit 110 may include a tuner unit 111 and a demodulation unit 112.

Unlike the figure, on the other hand, the display device 100 may include only the external device interface unit 171 and the network interface unit 172, among the broadcast reception unit 110, the external device interface unit 171, and the network interface unit 172. That is, the display device 100 may not include the broadcast reception unit 110.

The tuner unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

For example, when the selected broadcast signal is a digital broadcast signal, the tuner unit 111 may convert the broadcast signal into a digital IF (DIF) signal, and when the selected broadcast signal is an analog broadcast signal, the tuner unit 111 may convert the broadcast signal into an analog baseband video or audio (CVBS/SIF) signal. That is, the tuner unit 111 may process the digital broadcast signal or the analog broadcast signal. The analog baseband video or audio (CVBS/SIF) signal output from the tuner unit 111 may be directly input to the controller 180.

Meanwhile, the tuner unit 111 may sequentially select broadcast signals of all broadcast channels stored through a channel memory function, among received broadcast signals, and may convert each of the selected broadcast signals into an intermediate frequency signal or a baseband video or audio signal.

Meanwhile, the tuner unit 111 may include a plurality of tuners in order to receive broadcast signals of a plurality of channels. Alternatively, a single tuner may simultaneously receive broadcast signals of a plurality of channels.

The demodulation unit 112 may receive the digital IF (DIF) signal converted by the tuner unit 111, and may perform demodulation. After performing demodulation and channel decryption, the demodulation unit 112 may output a stream signal (TS). At this time, the stream signal may be a multiplexed image, audio, or data signal.

The stream signal output from the demodulation unit 112 may be input to the controller 180. After performing demultiplexing and image/audio signal processing, the controller 180 may output an image through the display module 150, and may output audio through the audio output unit 160.

The sensing unit 120 is a device configured to sense change inside or outside the display device 100. For example, the sensing unit 120 may include at least one of a proximity sensor, an illumination sensor, a touch sensor, an infrared (IR) sensor, an ultrasonic sensor, an optical sensor (e.g. a camera), an audio sensor (e.g. a microphone), a battery gauge, and an environmental sensor (e.g. a hygrometer or a thermometer).

The controller 180 may check the state of the display device 100 based on information collected by the sensing unit, and when a problem occurs, may inform a user of the same or may solve the problem, whereby the controller may perform control such that the display device is maintained in the best state.

In addition, the controller may differently control the content, quality, and size of an image provided to the display module 150 based on a viewer or ambient light sensed by the sensing unit in order to provide the optimum viewing environment. With progress of a smart TV, a large number of functions have been loaded in the display device, and the sensing unit 20 has also been increased in number.

The input unit 130 may be provided at one side of a main body of the display device 100. For example, the input unit 130 may include a touchpad or a physical button. The input unit 130 may receive various user commands related to the operation of the display device 100, and may transmit control signals corresponding to the received commands to the controller 180.

With a decrease in size of a bezel of the display device 100, many display devices 100 have been configured such that the number of physical button type input units 130 exposed to the outside is minimized in recent years. Instead, a minimum number of physical buttons is located at the rear surface or the side surface of the display device, and the display device may receive user input through the touchpad or the user input interface unit 173, a description of which will follow, using a remote controller 200.

The storage unit 140 may store programs for signal processing and control in the controller 180, and may store a processed image, audio, or data signal. For example, the storage unit 140 may store application programs designed to execute various tasks that can be processed by the controller 180, and may selectively provide some of the stored application programs in response to request of the controller 180.

Programs stored in the storage unit 140 are not particularly restricted as long as the programs can be executed by the controller 180. The storage unit 140 may temporarily store an image, audio, or data signal received from an external device through the external device interface unit 171. The storage unit 140 may store information about a predetermined broadcast channel through a channel memory function, such as a channel map.

FIG. 1 shows an embodiment in which the storage unit 140 and the controller 180 are separately provided; however, the present disclosure is not limited thereto. The storage unit 140 may be included in the controller 180.

The storage unit 140 may include at least one of a volatile memory (e.g. DRAM, SRAM, or SDRAM), a nonvolatile memory (e.g. flash memory), a hard disk drive (HDD), and a solid-state drive (SSD).

The display module 150 may convert an image signal, a data signal, an OSD signal, and a control signal processed by the controller 180 or an image signal, a data signal, and a control signal received from the interface unit 171 to generate a driving signal. The display module 150 may include a display panel 181 having a plurality of pixels.

Each of the plurality of pixels in the display panel may include RGB subpixels. Alternatively, each of the plurality of pixels in the display panel may include RGBW subpixels. The display module 150 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 150, and a 3D display may also be used. The 3D display 130 may be classified as a non-glasses type display or a glasses type display.

Meanwhile, the display module 150 may be constituted by a touchscreen, whereby an input device may also be used in addition to an output device.

The audio output unit 160 receives an audio signal processed by the controller 180 and outputs the same as audio.

The interface unit 170 serves as a path to various kinds of external devices connected to the display device 100. The interface unit may include a wireless system using an antenna as well as a wired system configured to transmit and receive data through a cable.

The interface unit 170 may include at least one of a wired/wireless headset port, an external charger port, a wired/wireless data port, a memory card port, a port for connection with a device having an identification module, an audio input/output (1/O) port, a video input/output (1/O) port, and an earphone port.

The broadcast reception unit 110 may be included as an example of the wireless system, and a mobile communication signal, a short-range communication signal, and a wireless Internet signal as well as a broadcast signal may be included.

The external device interface unit 171 may transmit or receive data to or from a connected external device. To this end, the external device interface unit 171 may include an A/V input and output unit (not shown).

The external device interface unit 171 may be connected to an external device, such as a digital versatile disc (DVD) player, a Blu-ray player, a game console, a camera, a camcorder, a computer (laptop computer), or a set-top box, in wired/wireless manner, and may perform input/output operation for the external device.

In addition, the external device interface unit 171 may establish a communication network with various remote controllers 200 in order to receive a control signal related to the operation of the display device 100 from each remote controller 200 or to transmit data related to the operation of the display device 100 to each remote controller 200.

The external device interface unit 171 may include a wireless communication unit (not shown) for short-range wireless communication with another electronic device. The external device interface unit 171 may exchange data with a mobile terminal adjacent thereto through the wireless communication unit (not shown). Particularly, in a mirroring mode, the external device interface unit 171 may receive device information, information of an application that is executed, and an image of the application from the mobile terminal.

The network interface unit 172 may provide an interface for connection of the display device 100 with a wired/wireless network including the Internet. For example, the network interface unit 172 may receive content or data provided by an Internet or content provider or a network operator through the network. Meanwhile, the network interface unit 172 may include a communication module (not shown) for connection with the wired/wireless network.

The external device interface unit 171 and/or the network interface unit 172 may include a communication module for short-range communication, such as Wi-Fi, Bluetooth, Bluetooth Low Energy (BLE), ZigBee, or Near Field Communication (NFC), or a communication module for cellular communication, such as Long-Term Evolution (LTE), LTE Advance (LTE-A), Code Division Multiple Access (CDMA), Wideband CDMA (WCDMA), Universal Mobile Telecommunications System (UMTS), or Wireless Broadband (WiBro).

The user input interface unit 173 may transmit a user input signal to the controller 180, or may transmit a signal from the controller 180 to a user. For example, the user input interface unit may transmit/receive a user input signal, such as power on/off, channel selection, or screen setting, to/from the remote controller 200, may transmit a user input signal, such as a power key, a channel key, a volume key, or a setting value, input from a local key (not shown) to the controller 180, may transmit a user input signal input from a sensor unit (not shown) configured to sense user gesture to the controller 180, or may transmit a signal from the controller 180 to the sensor unit.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit 111, the demodulation unit 112, the external device interface unit 171, or the network interface unit 172, or may process demultiplexed signals to generate and output a signal for image or audio output.

An image signal processed by the controller 180 may be input to the display module 150, which may display an image corresponding to the image signal. In addition, the image signal processed by the controller 180 may be input to an external output device through the external device interface unit 171.

An audio signal processed by the controller 180 may be output through the audio output unit 160. In addition, the audio signal processed by the controller 180 may be input to an external output device through the external device interface unit 171. Although not shown in FIG. 2, the controller 180 may include a demultiplexing unit and an image processing unit, which will be described below with reference to FIG. 3.

Further, the controller 180 may control the overall operation of the display device 100. For example, the controller 180 may control the tuner unit 111 such that a broadcast corresponding to a channel selected by a user or a pre-stored channel is tuned.

In addition, the controller 180 may control the display device 100 according to a user command input through the user input interface unit 173 or an internal program. Meanwhile, the controller 180 may control the display module 150 to display an image. At this time, the image displayed on the display module 150 may be a still image or video, or may be a 2D image or a 3D image.

Meanwhile, the controller 180 may perform control such that a predetermined 2D object is displayed in an image displayed on the display module 150. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 150, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 150 corresponding to the location of the user.

The controller 180 may sense user gesture based on the image captured by the photographing unit, a signal sensed by the sensor unit, or a combination thereof.

The power supply unit 190 may supply power to the components of the display device 100. In particular, the power supply unit may supply power to the controller 180, which may be implemented in the form of a system on chip (SOC), the display module 150 for image display, and the audio output unit 160 for audio output.

Specifically, the power supply unit 190 may include an AC/DC converter (not shown) configured to convert AC power into DC power and a DC/DC converter (not shown) configured to convert the level of the DC power.

Meanwhile, the power supply unit 190 serves to distribute power supplied from the outside to the respective components of the display device. The power supply unit 190 may be directly connected to an external power supply in order to supply AC power, or may include a battery so as to be used by charging.

In the former case, a cable is used, and the power supply unit is difficult to move or the movement range of the power supply unit is limited. In the latter case, the power supply unit is free to move, but the weight of the power supply unit is increased in proportion to the weight of the battery, the volume of the power supply unit is increased, and, for charging, the power supply unit must be directly connected to a power cable or must be coupled to a charging holder (not shown) that supplies power for a predetermined time.

The charging holder may be connected to the display device through a terminal exposed to the outside, or the battery mounted in the power supply unit may be charged in a wireless manner when the power supply unit approaches the charging holder.

The remote controller 200 may transmit user input to the user input interface unit 173. To this end, the remote controller 200 may use Bluetooth communication, radio frequency (RF) communication, infrared radiation communication, ultra-wideband (UWB) communication, or ZigBee communication. In addition, the remote controller 200 may receive an image, audio, or data signal output from the user input interface unit 173 so as to be displayed thereon or audibly output therefrom.

Meanwhile, the display device 100 may be a stationary or movable digital broadcast receiver capable of receiving a digital broadcast.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
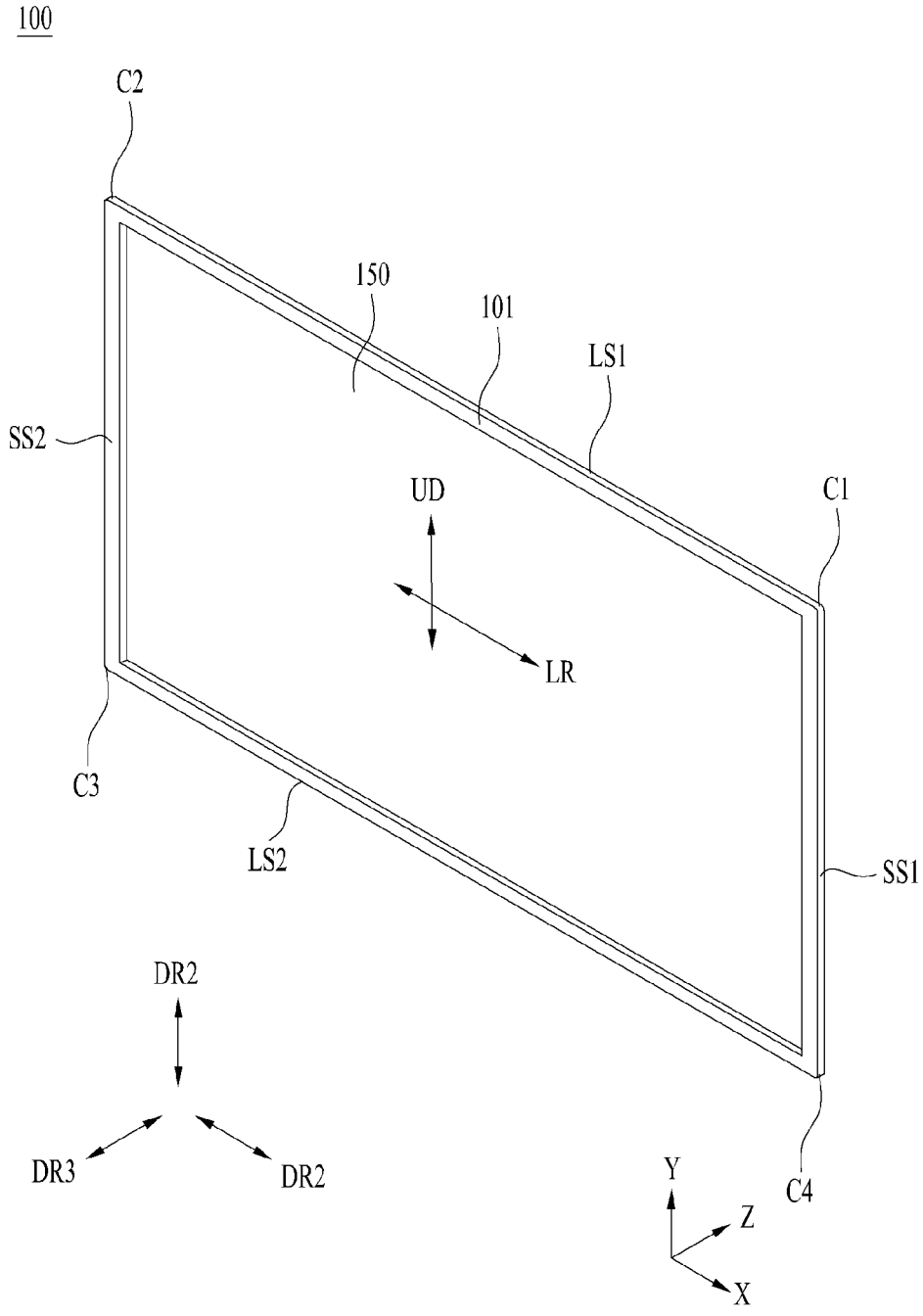
FIG. 2 is a perspective view showing an example of the display device according to the present disclosure.

FIG. 2 is a front perspective view showing an example of the display device.

Referring to FIG. 2, the display device 100 may have a rectangular shape including a first long side LS1, a second long side LS2 opposite the first long side LS1, a first short side SS1 adjacent to the first long side LS1 and the second long side LS2, and a second short side SS2 opposite the first short side SS1.

Here, the area of the first short side SS1 may be referred to as a first side area, the area of the second short side SS2 may be referred to as a second side area opposite the first side area, the area of the first long side LS1 may be referred to as a third side area adjacent to the first side area and the second side area and located between the first side area and the second side area, and the area of the second long side LS2 may be referred to as a fourth side area adjacent to the first side area and the second side area, located between the first side area and the second side area, and opposite the third side area.

In addition, the lengths of the first and second long sides LS1 and LS2 are shown and described as being greater than the lengths of the first and second short sides SS1 and SS2, for convenience of description; however, the lengths of the first and second long sides LS1 and LS2 may be approximately equal to the lengths of the first and second short sides SS1 and SS2.

Also, in the following description, a first direction DR1 may be a direction parallel to the long sides LS1 and LS2 of the display device 100, and a second direction DR2 may be a direction parallel to the short sides SS1 and SS2 of the display device 100. A third direction DR3 may be a direction perpendicular to the first direction DR1 and/or the second direction DR2.

From a different point of view, the side of the display device 100 on which a picture is displayed may be referred to as a front side or a front surface. When the display device 100 displays the picture, the side of the display device 100 from which the picture cannot be viewed may be referred to as a rear side or a rear surface. When viewing the display device 100 from the front side or the front surface, the side of the first long side LS1 may be referred to as an upper side or an upper surface. In the same manner, the side of the second long side LS2 may be referred to as a lower side or a lower surface. In the same manner, the side of the first short side SS1 may be referred to as a right side or a right surface, and the side of the second short side SS2 may be referred to as a left side or a left surface.

In addition, the first long side LS1, the second long side LS2, the first short side SS1, and the second short side SS2 may be referred to edges 351 of the display device 100. In addition, points at which the first long side LS1, the second long side LS2, the first short side SS1, and the second short side SS2 are joined to each other may be referred to as corners. For example, a point at which the first long side LS1 and the first short side SS1 are joined to each other may be a first corner C1, a point at which the first long side LS1 and the second short side SS2 are joined to each other may be a second corner C2, a point at which the second short side SS2 and the second long side LS2 are joined to each other may be a third corner C3, and a point at which the second long side LS2 and the first short side SS1 are joined to each other may be a fourth corner C4.

Here, a direction from the first short side SS1 to the second short side SS2 or a direction from the second short side SS2 to the first short side SS1 may be referred to as a leftward-rightward direction LR. A direction from the first long side LS1 to the second long side LS2 or a direction from the second long side LS2 to the first long side LS1 may be referred to as a vertical direction UD.

The display device includes a display module, which occupies a major portion of the front surface thereof, and a case configured to cover the rear surface and the side surface of the display module, the case being configured to package the display module.

In recent years, the display device 100 has used a flexible display module 150, such as light-emitting diodes (LED) or organic light-emitting diodes (OLED), in order to implement a curved screen.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid 2010 and has rapidly replaced the LCD in the small- or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply unit, and a first signal module located at a rear surface of the display panel. The display panel may include a plurality of pixels R, G, and B. The plurality of pixels R, G, and B may be formed at intersections between a plurality of data lines and a plurality of gate lines. The plurality of pixels R, G, and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface.

Figure 3:
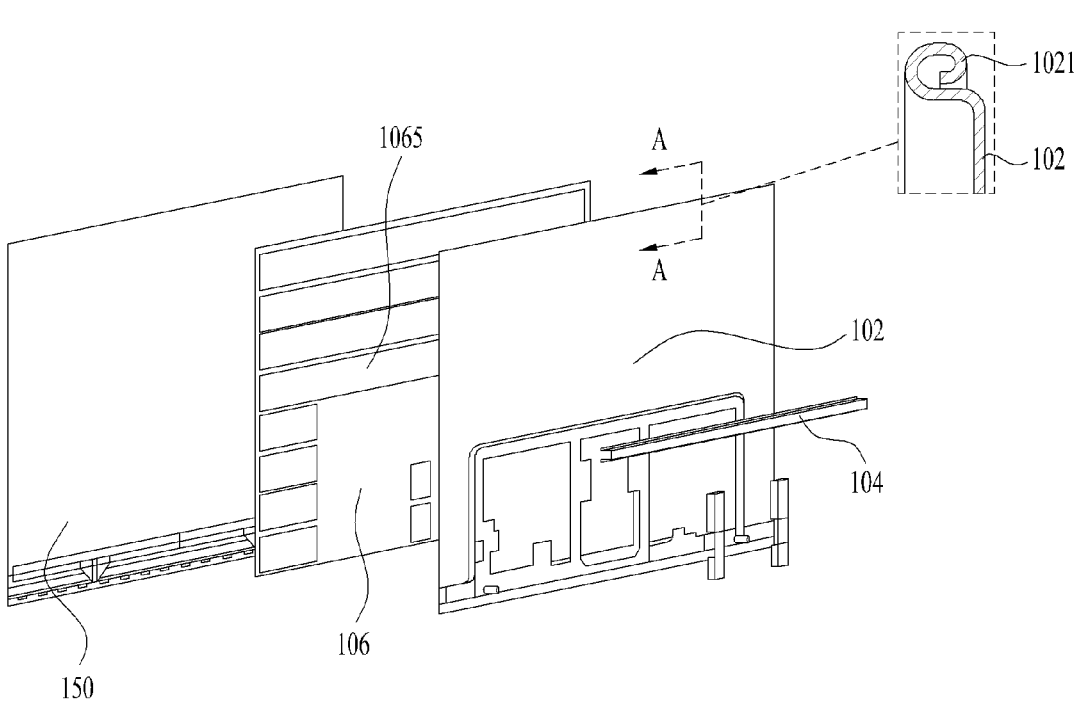
FIG. 3 is an exploded perspective view showing an example of an existing display device.

FIG. 3 is a diagram showing the existing display device 100. Because the organic light-emitting display device 100 does not have the backlight unit, a layered structure of the display module 150 is simple. As shown in FIG. 3, the display device 100 may include the display module 150, an inner plate 106, and a module cover 102.

An OLED display module may simplify a structure of a side surface thereof as components such as the backlight unit and a guide panel for aligning the panel may also be omitted. Unlike a housing structure of a display device containing an LCD display module, a case top coupled from the front may be omitted. Instead, referring to an A-A cross-section, the side surface structure of the display device 100 may be implemented by rolling an end of the module cover 102 that covers a rear surface.

A thickness of the display device 100 may be reduced by omitting the case top located at a perimeter of the front surface of the display module 150, and a size of a bezel may also be reduced by omitting a coupling structure between the case top and the module cover 102.

The inner plate 106 located on the rear surface of the display module 150 may be coupled with the display module 150 using a double-sided tape. Because the display module 150 is light, the display module 150 may be fixed without using a fastener such as a screw.

The inner plate 106 is in close contact with the rear surface of the display module 150 and performs a heat dissipation function of discharging heat generated from the display module 150, and, because a thickness of the display module 150 is small, is located on a front surface of the module cover 102 to reinforce the display module 150.

The module cover 102 includes a mounting portion 1025 where a connector that connects a board, such as a main board 181a, a power board 181b, and a T-con 181c, with each component is disposed on a rear surface thereof, and the mounting portion 1025 requires irregularity-processing for fastening of the components.

The module cover 102 may be made of galvanized steel, such as highly weather-resistant high polymer steel plate (PCM), that may be color coated, and thus, may be used as an exterior material. An area other than the mounting portion 1025 of the module cover 102 is exposed to the outside and forms an outer appearance of the display device 100, so that the PCM that is easy to paint may be used. A thickness of the module cover 102 may be reduced, and a thickness of the inner plate 106 may be made greater than that of the module cover 102 instead.

Because the inner plate 106 is heavy, the inner plate 106 is bonded using an adhesive 1065 to ensure adhesion to the module cover 102. The adhesive 1065 has a stronger adhesive force than the adhesive tape 201 described above and contracts and relaxes based on a temperature change, so that the adhesive 1065 may be omitted in an area corresponding to the mounting portion 1025 where the temperature change is great.

Considering rigidity, the module cover 102 may be formed thick, but the rigidity of the display device 100 may be reinforced by adding a rigid bar 104 to the rear surface thereof to reduce a manufacturing cost.

When a thickness of the large-area inner plate 106 is increased to secure the rigidity with the inner plate 106, there are problems of increasing the manufacturing cost and increasing a weight of a product. When the thicknesses of the inner plate 106 and the module cover 102 are reduced, the rigidity of the display device 100 deteriorates, so that when adding the rigid bar 104, the above-mentioned problems of the increased manufacturing cost and the increased weight still occur.

Figure 4:
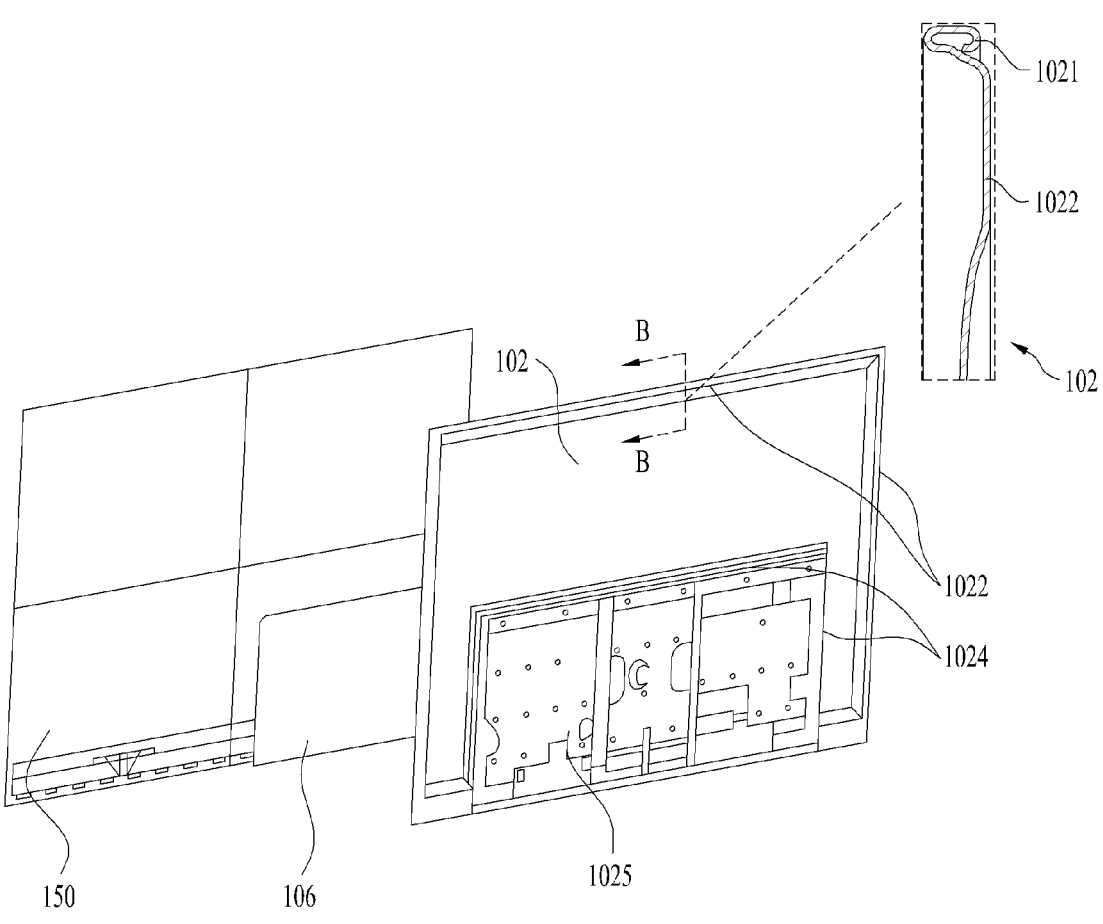
FIG. 4 is an exploded perspective view showing an example of a display device of the present disclosure.

FIG. 4 is an exploded perspective view showing an example of the display device 100 to solve the above problem. An embodiment in FIG. 4 is characterized in that a size of the inner plate 106 is reduced to a size corresponding to a size of the mounting portion 1025 to solve such problem.

The inner plate 106 may be formed to be reduced in size to the size corresponding to the mounting portion 1025 of the module cover 102, so that the inner plate 106 may be disposed only in a minimum space, and a first bead 1022 may be additionally formed at a perimeter of the module cover 102 to ensure the rigidity with the module cover 102.

The module cover 102 may be press-molded to form a shape of the mounting portion 1025 and a rolling edge 1021 at an end thereof. In this regard, the first bead 1022 may be formed at a perimeter of the display module 150.

The first bead 1022 may be formed by pressing the steel plate so as to protrude rearwards, as shown in a cross-section B-B. The first bead 1022 serves to increase the rigidity of the module cover 102, but because the bead artificially forms irregularities on a flat surface, the first bead 1022 becomes an element that impedes an exterior design of the display device 100 when exposed to the outside. Therefore, the first bead 1022 may be formed at the perimeter of the module cover 102, which is a location that is less visible to people as much as possible.

The first bead 1022 may be constructed to have an inclined portion that is inclined gently toward a center of the module cover 102 from a protruding portion that rearwardly protrudes the most so as not to be noticeable in the outer appearance.

Figure 5:
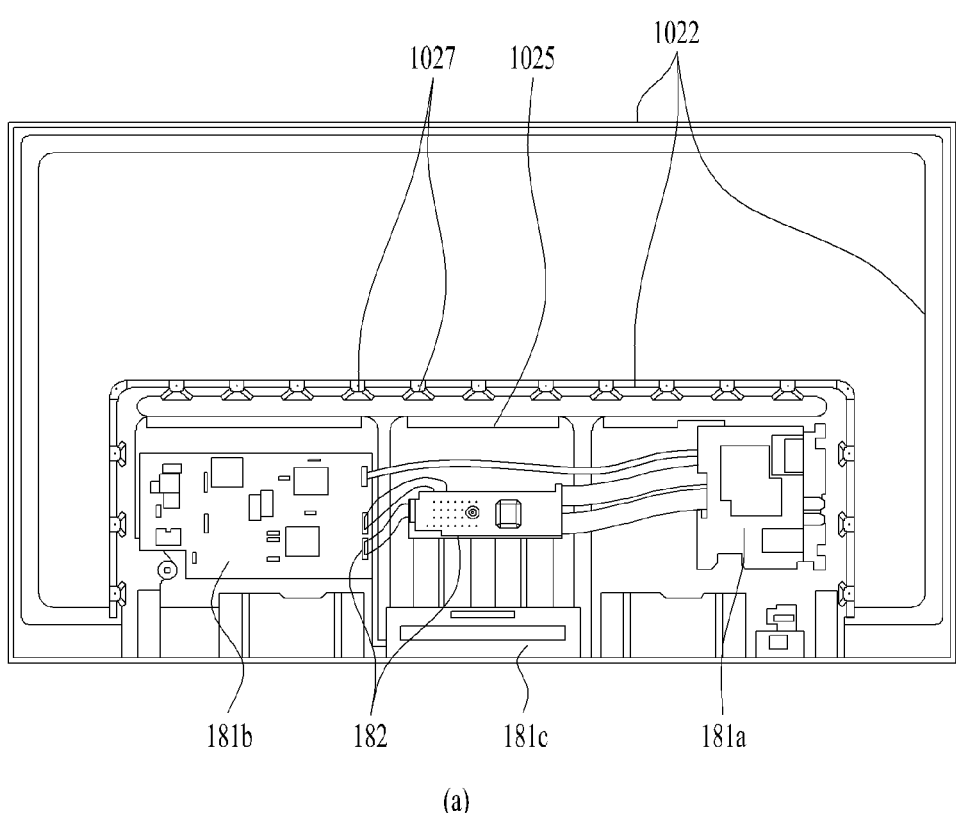
FIG. 5 is a diagram showing a rear surface and a front surface of a module cover of the present disclosure.
Figure 5:
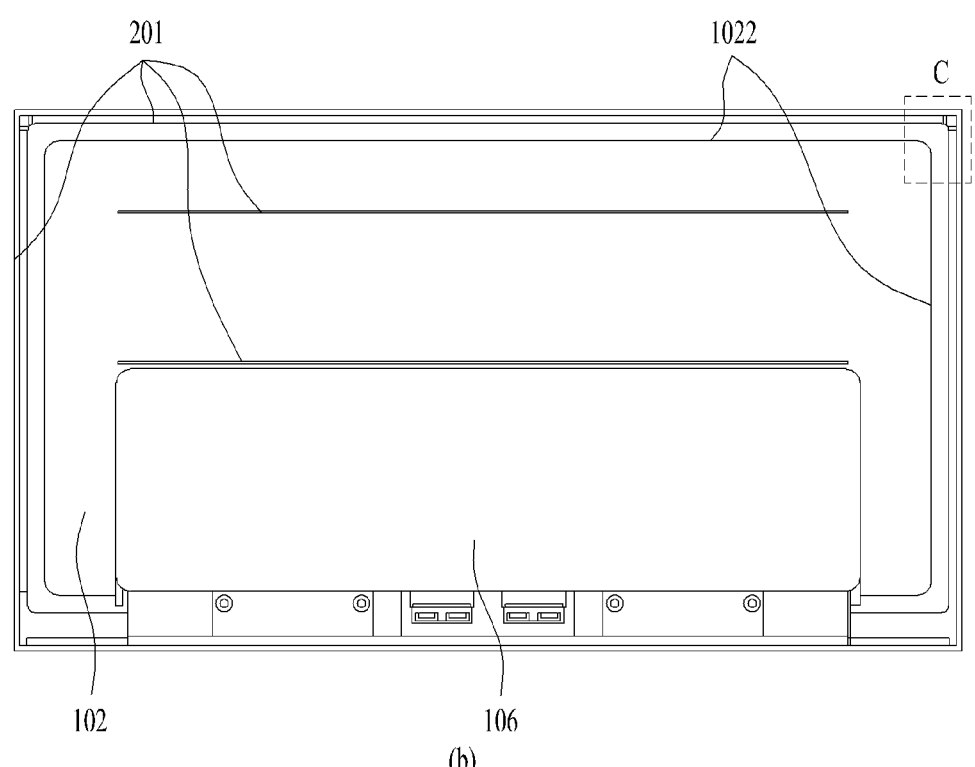

FIG. 5 is a view showing a rear surface and a front surface of the module cover 102 of the present disclosure. (a) shows the rear surface of the module cover 102. The rear surface of the module cover 102 may include the main board 181a that is responsible for driving, the power board 181b that is responsible for power distribution, the T-con (timing controller) 181c that converts image information into a signal of a display device IC (DDI) of the display module 150, and the like, and may include a cable connector 182 that connects the boards to each other and the like.

The circuits such as the main board 181a, the power board 181b, and the T-con 181c are mounted in the mounting portion 1025. When a separate plate is used for the component mounting, the number of components increases and the weight and the cost increase, so that the module cover 102 in the present embodiment may have the mounting portion 1025 directly in the module cover 102.

Figure 6:
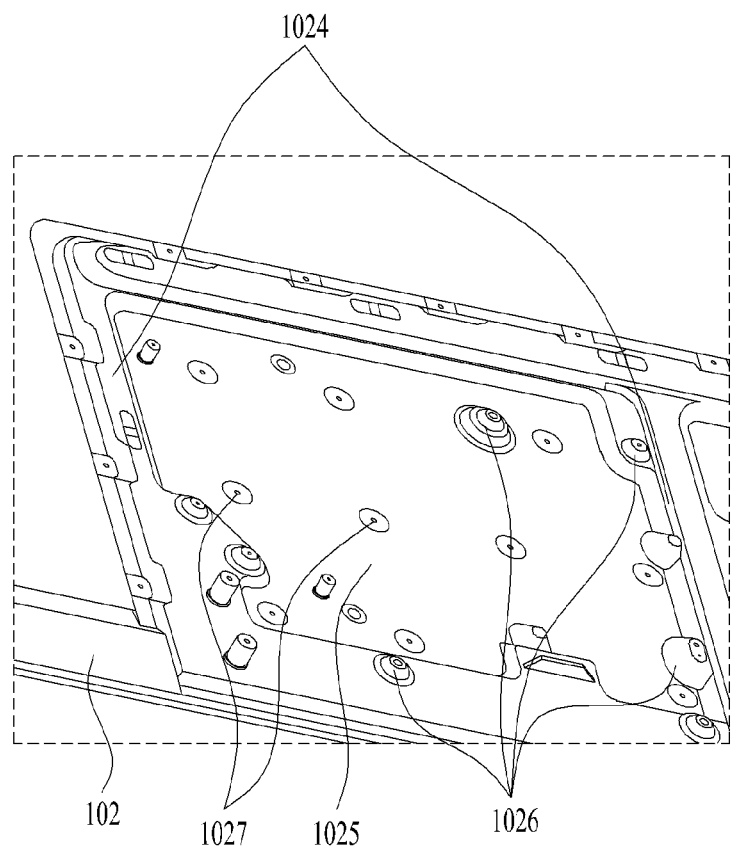
FIG. 6 is an enlarged view of a first area of a module cover of the present disclosure.

FIG. 6 is an enlarged view of the mounting portion 1025 of the module cover 102 of the present disclosure.

The mounting portion 1025 may be press-molded to form irregularities, and the irregularities may include a second bead 1024 molded for the rigidity and a press boss 1026 for the fastening. The boards are fastened to the press boss 1026, or a back cover (not shown) for covering is coupled to the press boss 1026.

The boss may be attached as a separate piece by defining a hole in the mounting portion 1025 of the module cover 102. However, to reduce the number of members and the number of processes and reduce the cost, the module cover 102 itself may be press-molded to form the press boss 1026 to which a screw or the like is fastened.

The press boss 1026 may be disposed to protrude rearwards so as to gave a predetermined spacing from the inner plate 106 at the front, thereby providing a space into which the fastener such as the screw may be inserted.

However, because the second bead 1024 and the press boss 1026 protrude rearward and are spaced apart from the inner plate 106, there is a problem in that heat is stored intensively as the heat is trapped in the separation space.

In particular, because a lot of heat is generated from the main board 181*a* and the power board 181*b*, the heat is generated most in the mounting portion 1025. When an entirety of the inner plate 106 is removed to reduce the cost and reduce the weight, it is difficult to discharge the heat concentrated in the mounting portion 1025.

To solve the above problem, instead of omitting the entirety of the inner plate 106, the inner plate 106 may be left on the mounting portion 1025 as shown in (b) in FIG. 5 and the inner plate 106 may be omitted from the remaining heat-resistant portion to reduce the weight of the inner plate 106 by half or more.

However, as the size of the inner plate 106 becomes smaller, the rigidity of the display device 100 may deteriorate. By making the module cover 102 slightly thicker, a certain amount of rigidity may be secured in the area where the inner plate 106 is omitted.

In addition, as described above, the rigidity may be further reinforced by molding the first bead 1022. The inner plate 106 overlapping the module cover 102 may be molded to be thinner than the existing inner plate 106 (about 0.8 mm, reduced by 30% or more compared to the existing inner plate), thereby reducing the weight increased by the module cover 102.

The inner plate may contain a metal material such as a hot dip galvanized iron (GI) steel plate. The galvanized iron steel plate is a material that increases corrosion resistance by galvanizing the steel plate and has rigidity without being easily corroded.

Referring to FIG. 4, the inner plate 106 and the module cover 102 are coupled to each other with the adhesive 1065, and the adhesive 1065 is omitted in the portion corresponding to the mounting portion 1025, so that the inner plate 106 located only on the mounting portion 1025 as in the present embodiment may not be able to use the adhesive 1065 when being coupled to the module cover 102.

As in the present disclosure, to place the inner plate 106 only in the area corresponding to the mounting portion 1025 of the module cover 102, the module cover 102 and the inner plate 106 may be fastened with each other via a clinching scheme 1027.

Figure 7:
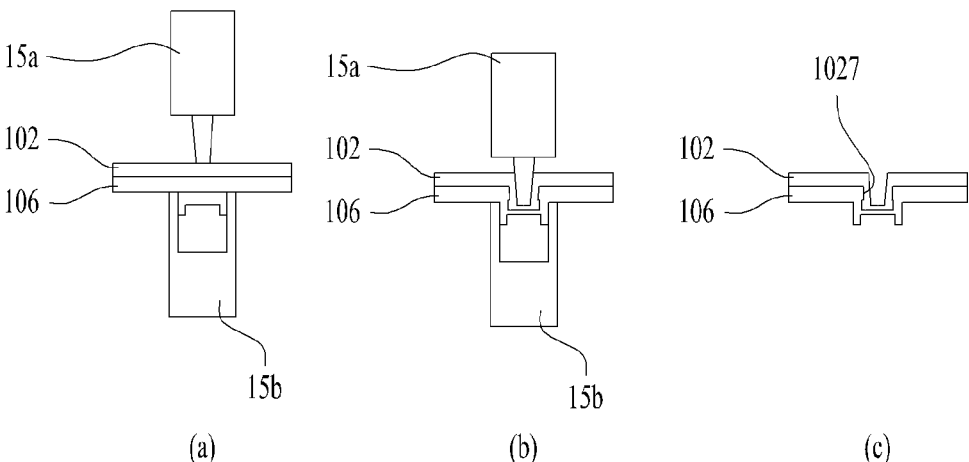
FIG. 7 is a diagram showing a method for fastening a module cover with an inner plate of the present disclosure.

FIG. 7 is a diagram showing a method for fastening the module cover 102 with the inner plate 106 in the clinching scheme. As shown in (a), two plates (the inner plate 106 and the module cover 102) are overlapped, and one side and the other side thereof are disposed between a pair of stampers 15*a* and 15*b*, respectively on a protruding portion 15*a* and a groove portion 15*b* corresponding to the protruding portion 15*a*.

As shown in (b), as the protruding portion 15*a* is pressed in a direction of the groove portion 15*b*, the plates 102 and 106 are pressed based on a shape of the protruding portion and are recessed into the groove portion, and the two plates are attached to each other as shown in (c). A rivet clinching scheme, which achieves fastening by fitting a rivet into the protruding portion 15*a* and inserting the rivet, is also applicable.

The clinching scheme may achieve the fastening without a separate fastener, so that there are advantages that a size of a fastening portion is small and the two plates are able to be easily coupled to each other.

The inner plate 106 is disposed at the location corresponding to the mounting portion 1025 and the mounting portion 1025 is a portion that is later covered by the back cover, so that the clinching fastening portion 1027 may not be exposed to the outside of the display device 100.

Because the second bead 1024 and the press boss 1026 protrude rearwards and are spaced apart from the inner plate, the clinching fastening 1027 may be performed in a portion where the second bead 1024 and the press boss 1026 are not located.

Figure 8:
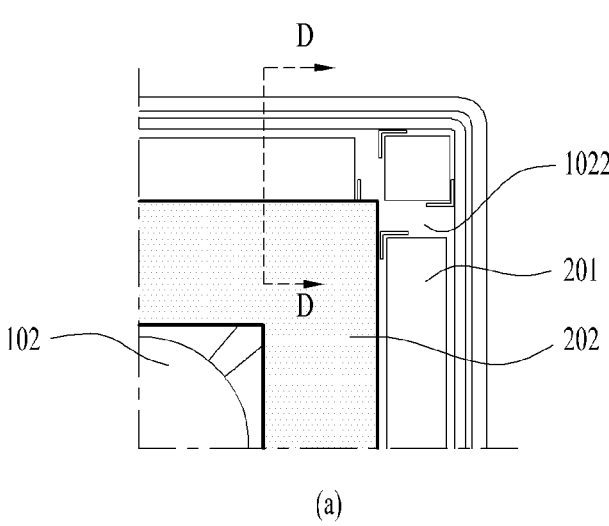
FIG. 8 is an enlarged view of a portion C in FIG. 5.
Figure 8:
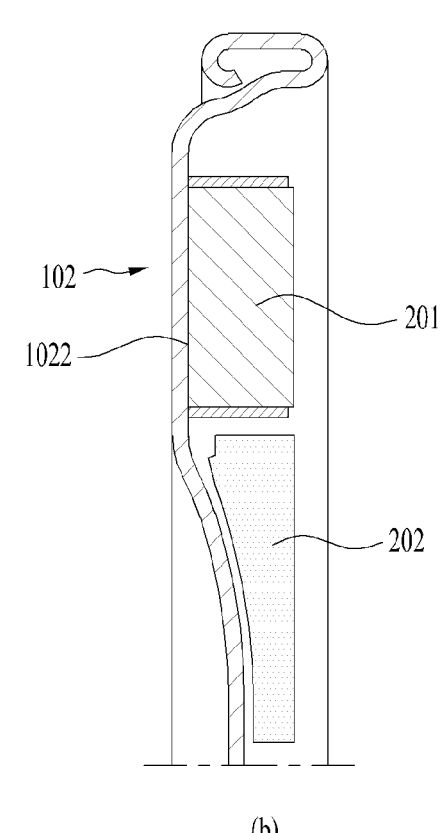

(a) in FIG. 8 is an enlarged view of a portion C in FIG. 5, and (b) is a D-D cross-sectional view of (a). The display module 150 may be attached to the module cover 102 by placing an adhesive tape 201 on a front surface of the first bead 1022. Because a space of the first bead 1022 in the space between the display module 150 and the module cover 102 is great, the adhesive tape 201 with sufficient adhesive strength may be disposed.

The first bead 1022 may include the inclined portion as shown in FIG. 4 such that a sense of heterogeneity is not felt significantly on the protruding portion. In the inclined portion, because a size of the space between the display module 150 and the module cover 102 changes, the adhesive tape 201 must be elastic or a member whose thickness varies must be disposed. In the structure of such inclined portion, stable coupling is difficult to be achieved because of a difference in the adhesive strength.

When the adhesive tape 201 is disposed only on the protruding portion, a gap remains between the inclined portion of the module cover 102 and the display module 150, and there is no inner plate 106 on the first bead 1022, so that there is a problem of heat concentration.

Figure 9:
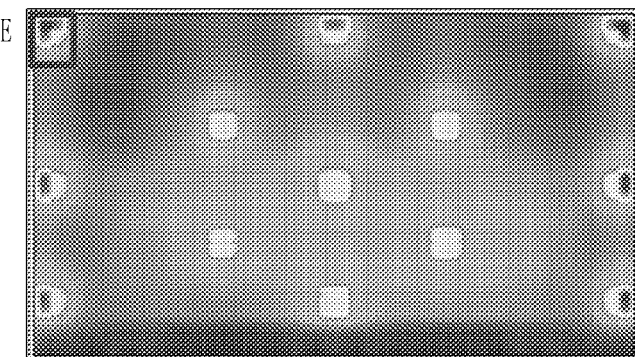
FIG. 9 is a diagram for illustrating a method for testing a temperature of a display device of the present disclosure.

FIG. 9 is a diagram to illustrate a method for testing a temperature of the display device 100 of the present disclosure, and a brightly lit portion is a portion where heat is supplied in a concentrated manner. In a center, the inner plate 106 is located or the module cover 102 is attached to the rear surface of the display module 150, so that the heat is dissipated relatively well. However, the heat is concentrated in an area where the first bead 1022 is located at the perimeter. In other words, a problem that the heat is trapped in the inclined portion and the heat dissipation is not performed smoothly occurs.

To solve such problem, as shown in FIG. 8, a heat dissipating cushion 202 made of an elastic material that may fill the portion corresponding to the inclined portion may be interposed. The heat dissipating cushion 202 may contain a material with high thermal conductivity, such as aluminum, and may be implemented in a mesh form to have elasticity.

Because the heat dissipating cushion 202, which has the high thermal conductivity, is in direct contact with the rear surface of the display module 150, heat dissipation efficiency ay be increased as the heat is transferred to the module cover 102.

Referring to a table in FIG. 9, it may be seen that when the heat dissipating cushion 202 is disposed, the temperature drops by 8° C. or more compared to when the heat dissipating cushion 202 is not disposed, and thus, the heat dissipation efficiency is improved.

As described above, the display device 100 of the present disclosure may reduce the inner plate 106 in size, thereby reducing the manufacturing cost and reducing the weight.

In addition, the decrease in the rigidity and the heat dissipation performance caused by reducing the inner plate 106 in size may be solved via the module cover 102.

The above detailed description should not be construed as being limitative in all terms, but should be considered as being illustrative. The scope of the present invention should be determined by reasonable analysis of the accompanying claims, and all changes in the equivalent range of the present invention are included in the scope of the present invention.

What is claimed is:

1. A display device comprising:
   a display module;
   a module cover located on a rear surface of the display module and including a mounting portion coupled with a printed circuit board;
   the printed circuit board coupled to the mounting portion; and
   an inner plate located between the display module and the module cover,
   wherein the inner plate has a size corresponding to a size of the mounting portion and is disposed on a front surface of the mounting portion; and
   wherein the module cover further comprising:
      a first bead press-molded at a perimeter of the module cover;
      an adhesive tape located on the first bead; and
      a heat dissipating cushion located on the first bead; and wherein the first bead includes:
   a protruding portion rearwardly protruding away from a rear surface of the display module in a first direction, the first direction extends orthogonal to the rear surface of the display module; and
   an inclined portion extending inwardly towards the rear surface of the display module in the first direction, and
   a distance in the first direction between the protruding portion and the rear surface of the display module is greater than a distance in the first direction between any other portion of the module cover and the rear surface of the display module,
   wherein the adhesive tape is located on the protruding portion,
   wherein the heat dissipating cushion is located on the incline portion.

2. The display device of claim 1, wherein the heat dissipating cushion includes an aluminum mesh.

3. The display device of claim 1, wherein the inner plate and the module cover are fastened to each other via a fastener.

4. The display device of claim 1, further comprising:
   a second bead press-molded on the mounting portion; and
   a press boss press-molded on the mounting portion.

5. The display device of claim 1, wherein the inner plate includes a galvanized iron steel plate.

\* \* \* \* \*